Figure 1:
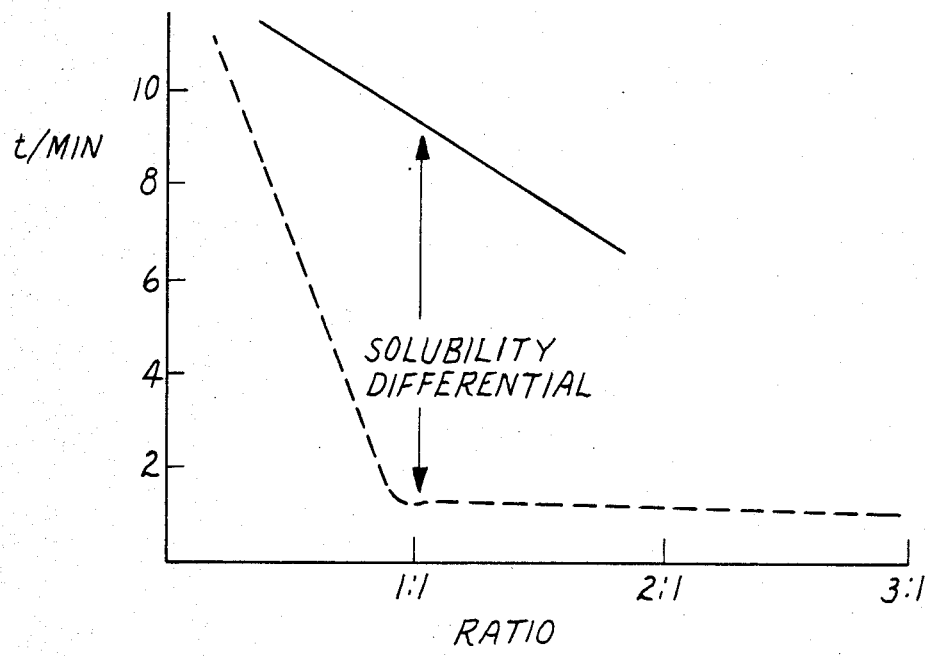

United States Patent [19]

Newman

[11] Patent Number: 4,708,925

[45] Date of Patent: Nov. 24, 1987

[54] PHOTOSOLUBILIZABLE COMPOSITIONS CONTAINING NOVOLAC PHENOLIC RESIN

[75] Inventor: Stephen Newman, Bishops Stortford, England

[73] Assignee: Minnesota Mining and Manufacturing Company, St. Paul, Minn.

[21] Appl. No.: 883,175

[22] Filed: Jul. 8, 1986

Related U.S. Application Data

[63] Continuation of Ser. No. 680,486, Dec. 11, 1984, abandoned.

[51] Int. Cl.$^4$ .................................................. G03C 1/76
[52] U.S. Cl. .................................... 430/270; 430/280; 430/326; 522/31; 522/156
[58] Field of Search .................... 430/270, 280, 326; 522/31, 166

[56] References Cited

U.S. PATENT DOCUMENTS

| | | | |
|---|---|---|---|
| 4,026,705 | 5/1977 | Crivello et al. | 96/27 R |
| 4,058,401 | 11/1977 | Crivello | 96/115 R |
| 4,102,687 | 7/1978 | Crivello | 96/115 R |
| 4,138,255 | 2/1979 | Crivello | 522/166 |
| 4,173,551 | 11/1979 | Crivello | 260/18 EP |
| 4,193,799 | 3/1980 | Crivello | 430/319 |
| 4,230,814 | 10/1980 | Crivello | 522/166 |
| 4,247,611 | 1/1981 | Sander et al. | 430/286 |
| 4,247,616 | 1/1981 | Vikesland et al. | 430/192 |
| 4,398,014 | 8/1983 | Green et al. | 522/166 |

Primary Examiner—Jack P. Brammer
Attorney, Agent, or Firm—Donald M. Sell; James A. Smith; Mark A. Litman

[57] ABSTRACT

Radiation-sensitive elements, e.g. printing plates, comprising a substrate having coated thereon a photosolubilizable composition comprising an alkali-soluble phenolic resin and an onium salt. The onium salt imparts a solvent resistance to the phenolic resin which is removed upon exposure to radiation thereby providing a solubility differential between exposed and unexposed areas of the composition.

14 Claims, 1 Drawing Figure

PHOTOSOLUBILIZABLE COMPOSITIONS CONTAINING NOVOLAC PHENOLIC RESIN

This is a continuation of application Ser. No. 680,486 filed Dec. 11, 1984, now abandoned.

This invention relates to a radiation-sensitive composition of particular utility in both positive and negative-acting printing plates.

A positive-acting printing plate comprises a radiation-sensitive coating which, after exposure to the appropriate wavelength light, becomes more soluble in developer than non-exposed areas. In practice, the vast majority of coatings which undergo photosolubilisation upon exposure consist of quinone diazides, commonly known as diazo oxides, together with phenolic resins. Diazo or diazonium photosensitive coatings are primarily sensitive to actinic light of a wavelength between 350 nm to 410 nm; by the addition of various additives the sensitivity can be increased to 550 nm. U.S. Pat. No. 4,248,959 discloses the sensitisation of negative-acting compositions which utilise diazonium salts and reports that positive-acting quinone diazide systems do not exhibit the ability to be dye sensitised for use with visible laser radiation.

The ability to produce a direct laser addressable plate is an ever increasing market need, as more and more images for photographic transferral to printing plates are being arranged and even generated by computer. These images include computer generated characters for photo-typesetting, computerised copy editing and justification, and computerised scanning and halftone "screening" of continuous tone pictures. These images may first appear in "soft" form, e.g. on a cathode ray tube, and then be made into a "hard" copy, for example a photographic transparency to be used as a light mask. Eliminating the need of the transparency and being able to go direct to the plate has the advantage of removing a complete stage in the process, with the associated savings in time, errors and expense.

Visible or infrared laser radiation has been used to perform mechanical or thermal work such as melting, vapourising or ablating, to form a printing plate. However, all uses of the laser which involve imaging by means of ablation, instead of photohardening or photosolubilisation, are economically inferior because of high power requirements and attendant cooling costs.

In contrast to quinone diazides and diazonium salts which can only be poorly sensitised, if at all, onium salts are very readily sensitised by wide classes of compounds covering the whole of the visible and infrared regions of the electromagnetic spectrum.

Onium salts have been utilised as initiators in the polymerisation of cationically polymerisable materials. British Patent Application Publication Nos. 2 061 280A, 2 042 550A, 2 027 435A, 2 013 208, U.S. Pat. Nos. 4,250,053 and 4,026,705, and European Patent Application Publication Nos. 54509, 44274 and 35969 disclose cationically polymerisable compositions including onium salts such as diaryliodonium salts, aromatic onium salts, triarylsulphonium salts, aromatic sulphonyl sulphoxonium salts and carbamoyl sulphoxonium salts. The compounds disclosed may be polymerised upon exposure to radiation and/or heating to provide hard tack-free resistant materials.

A method of preparing photosolubilising coatings is disclosed in U.S. Pat. No. 4,247,611. Organic polymeric compounds with recurrent acetal or ketal groups in the main chain are utilised whose solubility in a liquid developer is increased by the action of acid. The acid is generated in exposed areas by the action of actinic radiation on acid releasing molecules. Phenolic resins are disclosed as optional alkali-soluble binders for incorporation in addition to the photosolubilisable polyacetal or polyketal.

It has been found that there is an interaction between alkali-soluble phenolic resins and onium salts which results in a solvent resistance, more particularly an alkali solvent resistance, to the composition when it is cast into a film. Furthermore, the photolytic decomposition of the onium salt restores solubility to the resin, thus fulfilling the basic requirements of a photosolubilising system. Onium salts can be sensitised to a wide range of the electromagnetic spectrum from the UV through the visible and into the infrared.

Therefore according to the present invention there is provided a radiation-sensitive composition comprising an alkali-soluble phenolic resin and a radiation-sensitive salt, characterised in that the composition is photosolubilisable.

According to a further aspect of the invention there is provided a radiation-sensitive element comprising a layer of a composition of the invention coated on a substrate.

Phenolic resins which are used in this invention are those which are alkali-soluble, i.e. they contain sufficient phenolic OH groups to render the polymer soluble in aqueous alkali. This solubility is such that a phenolic resin coating in the absence of onium salt, would be removable by mild rubbing and soaking in 20% aqueous sodium metasilicate pentahydrate at 20° C. within 20 minutes. Thus, the solubility is sufficient to enable a film of the polymer to be removed from a substrate during the development stage.

It has been found that when an onium salt is mixed with an alkali-soluble phenolic resin it imparts a solvent resistance to the resin with respect to aqueous alkali solvents. This solvent resistance is reduced upon irradiation thereby providing a differential solubility between exposed and non-exposed areas of such phenolic resin/onium compositions. The photosolubilisable property of the phenolic resin/onium compositions can provide the basis of an imaging system, e.g. for the production of printing plates.

The radiation-sensitive elements or compositions of the invention possess properties which are completely different from those of the prior art compositions comprising onium salts. Whilst certain of the prior art references referred to above disclose compositions comprising polymerisable phenolic resin and an onium salt, the prior art compositions are polymerised upon exposure to radiation and/or heat whereas the compositions of the invention are not polymerised upon exposure to radiation but are transformed from a relatively alkali-insoluble state to an alkali-soluble state upon exposure to radiation. It appears that many of the specific phenolic resins used in the prior art were modified with functional groups, e.g. epoxy, vinyl and allyl, to allow free radical or cationic polymerisation. These functionalities were bonded either directly onto the aromatic nucleus or indirectly through the oxygen linkage. In the latter case, alkali-solubility of the resin would be significantly decreased. In general, the onium salts are used in catalytic amounts of up to 4% by weight of polymerisable material, usually up to 2%. Furthermore, most of the compositions of the prior art tended to be oils or gums whereas in general those of the subject invention are in the form of non-tacky solids.

The compositions of the invention comprise two essential components, namely a phenolic resin and an onium salt, both of which components are readily available. The compositions are simple and effective for use in the production of printing plates and do not require the presence of specialised polymers, e.g. polymers containing acetal or ketal groupings, as are often required in the photosolubilising systems of the prior art.

The composition comprising alkali-soluble resin and photosolubiliser is initially alkali-insoluble and upon irradiation the onium salts decompose restoring the original solubility of the resin, thus rendering the composition alkali-soluble. In order to ensure alkali-solubility of the composition upon irradiation, the composition must be substantially free from functional groups which would polymerise/cross-link in the presence of onium salts upon irradiation. Thus, the phenolic resin should not be heavily modified with functional groups, e.g. epoxy, vinyl and allyl groups, which would cross-link or polymerise in the presence of onium salts upon irradiation leading to permanent insolubilisation of the resin. Furthermore, such functional groups should not be present in the composition in the form of additional components, e.g. monomers. binder. etc. Thus, the phenolic resins used in the invention are non-polymerisable although they are capable of being cross-linked upon heating by a reaction involving the elimination of water.

Whilst the phenolic resins have been classified herein in relation to their alkali-solubility, it will readily be appreciated that other solvent systems may be used in place of an aqueous alkali developer in the preparation of printing plates. In certain cases the differential solubility between exposed and unexposed compositions may be enhanced in relation to solvent systems other than aqueous alkali, e.g. aqueous organic solvent mixtures such as methanol or acetone and water mixtures.

The phenolic resins useful in this invention are the condensation products from the interaction between phenol, C-alkyl substituted phenols (including cresols, xylenols, p-tert-butyl-phenol, p-phenylphenol and nonyl phenols), diphenols, e.g. bisphenol-A (2,2-bis(4-hydroxyphenyl)propane), and aldehydes such as formaldehyde, acetaldehyde, chloral and furfuraldehyde. The type of catalyst and the molar ratio of the reactants used in the preparation of phenolic resins determines their molecular structure and therefore the physical properties of the resin. An aldehyde:phenol ratio between 0.5:1 and 0.1:1 usually 0.5:1 to 0.8:1, and an acid catalyst is used to prepare those phenolic resins generally known as novolacs which are thermoplastic in character. Higher aldehyde:phenol ratios of more than 1:1 to 3:1, and a basic catalyst give rise to a class of phenolic resins known as resoles, and these are characterised by their ability to be thermally hardened at elevated temperatures. Both these classes of phenolic resin, novolacs and resoles, are useful in this invention. Examples of the resins used in this invention are BKR 2620 from Bakelite Xylonite Ltd., and Arofene 24780 from Ashland Chemicals which are resoles, and CRJ 406 from Schenectady Chemicals Inc. and Reichhold 29802 from Reichhold Chemicals Inc. which are novolacs.

In addition to the resin, there is required a photosolubiliser which is an onium salt. Suitable onium salts include iodonium, sulphonium, bromonium, chloronium, oxysulphonium, sulphoxonium, selenonium, telluronium, phosphonium and arsonium salts. Preferably, an iodonium, sulphonium or oxysulphonium is present, most preferably it is an iodonium salt since it is the most photosensitive and also the easiest to spectrally sensitise.

The onium salt is generally included in the composition in an amount in the range from 1 to 40% by weight of the total weight of phenolic resin and onium salt. The amount of onium salt is selected to provide the desired solubility differential between the unexposed and exposed compositions. It has been found that resole resins normally require the onium salt in an amount of at least 5% by weight of the total weight of phenolic resin and onium salt in order to ensure a satisfactory solubility differential. Generally, compositions employing resole resins will include at least 7% by weight of onium salt. It is possible to achieve a satisfactory solubility differential in compositions containing novolac resins containing smaller amounts of onium salt, generally in the range 1 to 40% by weight of onium salt.

Iodonium salts are compounds having a positively charged iodine atom bearing two covalently bonded carbon atoms and any anion. Aliphatic iodonium salts are not normally thermally stable at temperatures above 0° C. However, stabilised alkyl phenyl iodonium salts such as those disclosed in Chem. Lett. 1982, 65-6 are stable at ambient temperatures and may be used in the invention. The Preferred compounds are diaryl and aryl-heteroaryl iodonium salts in which the carbon-toiodine bonds are from aryl or heteroaryl groups.

Suitable iodonium salts may be represented by the formula:

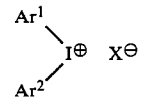

in which:

Ar$^1$ and Ar$^2$ independently represent aromatic groups optionally substituted and optionally linked together to include the iodine atom within a ring structure, preferably a heterocyclic aromatic ring, and X$^\ominus$ represents an anion.

These aromatic groups generally have from 4 to 20 carbon atoms, may be selected from aromatic hydrocarbon rings, e.g. phenyl or naphthyl and hetero-aromatic groups including thienyl, furanyl and pyrazolyl, and may be substituted with alkyl groups, e.g. methyl, alkoxy groups, e.g. methoxy, chlorine, bromine, iodine, fluorine, carboxy, cyano or nitro groups, or any combinations thereof. Condensed aromatic-heteroaromatic groups, e.g. 3-indolinyl, may also be present.

Preferably Ar$^1$ and Ar$^2$ do not have more than two substituents at the α positions of tne aryl groups. Most preferably Ar$^1$ and Ar$^2$ are both phenyl groups containing no α substituents.

The α positions of the aryl groups may be linked together to include the iodine atom within a ring structure to give a formula such as:

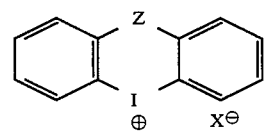

in which Z is an oxygen or sulphur atom.

Other suitable iodonium salts include polymers containing the monomeric unit:

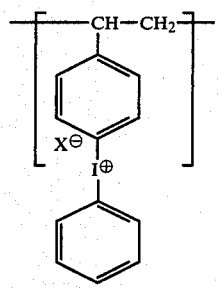

Any anion appears to be useful as the counter-ion in the onium salt. Preferably the acid from which the anion is derived has a pKa<5. Suitable inorganic anions include halide anions, $HSO_4-$, and halogen-containing complex anions, e.g. tetrafluoroborate, hexafluorophosphate, hexafluoroarsenate and hexafluoroantimonate. Suitable organic anions include those of the formulae:

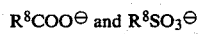

in which $R^8$ is an alkyl or aryl, e.g. phenyl, group either of which may be substituted. Examples of such anions include $CH_3COO^\ominus$ and $CF_3COO^\ominus$.

The most significant contribution of the anion is its effect upon the solubility of the onium salt in different solvents or binders.

Sulphonium salts are also useful in this invention as they are photosensitive and can also be spectrally sensitised. As they comprise a positively charged sulphur atom bearing three covalently bonded carbon atoms, they are however more prone to steric hindrance which can limit the extent of interaction between sulphonium salts and phenolic resins.

Aromatic sulphonium salts having the following formula are useful in this invention:

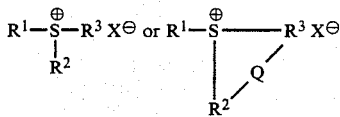

in which:
at least one of $R^1$, $R^2$ and $R^3$ is an optionally substituted aromatic group which preferably has from 4 to 20 carbon atoms, the remaining groups being selected from optionally substituted aliphatic groups containing up to 12 carbon atoms, preferably up to 6 carbon atoms and aromatic groups as defined above. Preferably $R^1$, $R^2$ and $R^3$ are each aromatic.

Q is a carbon-to-carbon bond or a linking group selected from

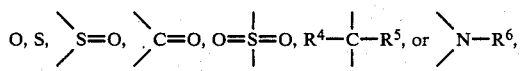

in which
$R^4$ and $R^5$ are independently selected from hydrogen, an alkyl group having from 1 to 4 carbon atoms, and an alkenyl group having from 2 to 4 carbon atoms, $R^6$ is an aryl group having from 6 to 20 carbon atoms, such as phenyl, or an acyl group having from 2 to 20 carbon atoms, such as acetyl or benzoyl, and $X^\ominus$ is an anion.

Aromatic sulphonium salts are known and recognised in the art. Triaryl-substituted sulphonium compounds, for example, can be prepared by the procedures described in C. H. Wiegand et al, "Synthesis and Reactions of Triarylsulphonium Halides", J. Org. Chem. 33, 2671–75 (1968). Aromatic sulphonium salts also having alkyl substitution can be prepared by the procedures described in K. Ohkubo et al, J. Org. Chem. 36, 3149–55 (1971). The preferred method for making triaryl-substituted sulphonium compounds is described in U.S. Pat. No. 2,807,648 from which complex sulphonium salts of complex ions can be made. The complex sulphonium salts can be prepared from the corresponding simple salts such as bisulphate or halide salts, by metathesis with a metal or ammonium salt or acid of the complex anion desired.

The aromatic groups may be selected from phenyl, thienyl and furanyl groups. The aromatic groups may optionally have one or more fused benzo rings (e.g. naphthyl, benzothienyl, dibenzothienyl, benzofuranyl and dibenzofuranyl). The aromatic groups may also be substituted, if desired, by groups which are essentially non-reactive with other components present in the particular composition in which the salt is to be used, such as halogen, nitro, aryl, ester groups (including alkoxycarbonyl), such as methoxycarbonyl, ethoxycarbonyl and phenoxycarbonyl, and acyloxy (such as acetoxy and propionyloxy), alkoxy groups (such as methoxy, ethoxy and butoxy), aryl groups (such as phenyl), alkyl groups (such as methyl, ethyl and t-butyl), aryloxy groups (such as phenoxy), alkyl-sulphonyl groups (such as methylsulphonyl and ethylsulphonyl), arylsulphonyl groups (such as phenylsulphonyl), hydrocarbylthio groups (such as p-phenylthio and methylthio) and perfluoroalkylsulphonyl groups (such as trifluoromethylsulphonyl and perfluoro- butylsulphonyl).

Of the aromatic sulPhonium complex salts, the preferred salts are the triaryl-substituted salts such as triphenylsulphonium hexafluorophosphate. The triaryl-substituted salts are preferred because they are more thermally stable than the mono- and diarylsubstituted salts and are more amenable to dye sensitisation.

The following sulphonium salts containing oxygen-sulphur linkages are also useful in this invention.

sulphoxonium salts of the general structure.

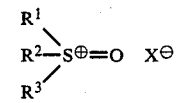

as disclosed in U.S. Pat. Nos. 4,339,567, 4,383,025 and 4,398,014, oxysulphonium salts of the general formula.

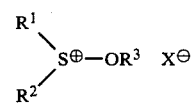

as disclosed by C. R. Johnson and W. G. Phillips in J. Org. Chem. Vol. 32, 1967 (1926), and oxysulphoxonium salts of the general formula.

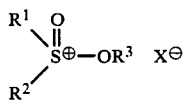

as disclosed by G. R. Chalkley et al. in J. Chem. Soc. (C) 1970, p. 682, in which $R^1$ to $R^3$ are as defined above, with the exception that each of $R^1$ to $R^3$ may represent optionally substituted aliphatic groups.

Phosphonium salts are also useful as photosolubiliser salts in the composition of the invention, but only those which are photosensitive, e.g. J. Macromol. Sci. Chem. 1982, A18, 1011-1020.

Other phosphonium salts are less effective. For example, a photosolubilising coating can be prepared using benzyltriphenylphosphonium hexafluorophosphate as the light sensitive agent, but these coatings require approximately thirty times as much exposure as a comparative iodonium coating to enable a reasonable differential in solubility to be achieveo. In general, phosphonium salts are far less photosensitive than iodonium salts.

The maximum sensitivity of the binary mixtures of the invention is generally in the ultraviolet region. However, the sensitivity of the mixtures can readily be adjusted by the addition of one or more sPectral sensitisers. Suitable spectral sensitisers are well known in the art and cover the full spectral range from UV to infrared (280 to 1100 nm). Normal sources for exposure of photosensitive lithographic plates are designed to emit ultraviolet light to match the sensitivity of commercially available plates. However, the light sources often also emit visible light to which prior art plates are insensitive. The compositions of the invention may be sensitised to cover the full spectral range thereby making maximum use of the exposure energy. Additionally, increased sensitivity to UV light may be achieved.

Examples of compounds which are known to sensitise onium salts are those in the following classes: diphenylmethane including substituted diphenylmethane, such as amino substituted diphenylmethane, xanthene, acridine, methine and polymethine (including oxonol, cyanine and merocyanine) dye, thiazole, thiazine, azine, aminoketone, porphyrin, coloured aromatic polycyclic hydrocarbon, p-substituted aminostyryl compound, aminotriazyl methane, polyarylene, polyarylpolyene, 2,5-diphenylisobenzofuran, 2,5-diarylcyclopentadiene, diarylfuran, diarylthioiuran, diarylpyrrole, polyarylphenylene. coumarin and polyaryl-2-pyrazoline. The addition of a sensitiser to the system renders it sensitive to any radiation falling within the absorption spectrum of the said sensitiser. The efficiency of the irradiation will increase the nearer it coincides with $\lambda_{max}$ of the sensitiser.

Generally sensitisers of the reactive type, those which are attacked by the photoproducts of exposure, such as oxonol dyes, are incorporated at levels of up to 10% by weight of the total weight of phenolic resin, onium salt and sensitiser. The sensitiser is generally present in an amount of from 5 to 200% molar with respect to the onium salt.

Energy transfer sensitisers which are not attacked by photoproduct would be useful at much lower levels of incorPoration, e.g. 0.1 to 5% molar with respect to the onium salt.

Preferably sensitisers are oxonol dyes and cyanine dyes, particularly cyanine dyes of the formula:

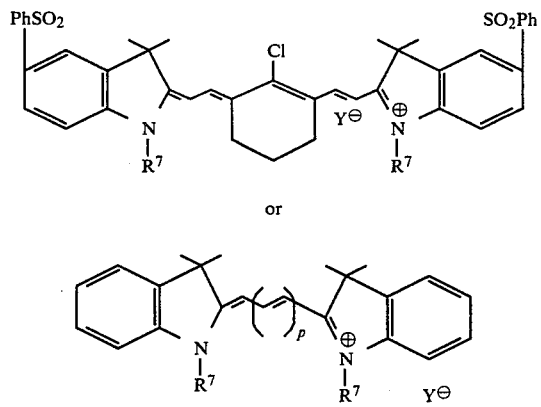

in which:

$R^7$ represents an alkyl group of 1 to 6 carbon atoms, e.g. methyl, ethyl, n-butyl, n-hexyl, $Y^\ominus$ represents an anion, such as $C_2F_5C_6F_{10}SO_3^\ominus$ (perfluoro(4-ethylcyclohexyl)sulphonate), or $ClO_4^\ominus$; and p is 1 or 2.

While in many cases it is possible to prepare photosolubilising systems from phenolic resins and onium salts, there are some phenolic resins which do not readily revert to an alkali-soluble form after having been irradiated. This is thought to be because in these cases the photolysed onium salt abstracts a hydrogen atom from the resin, which then either dimerises or undergoes further oxidation to form a carbonyl functionality from what originally was a phenolic-OH group. Both of these reactions would cause the resin to decrease its alkali solubility. In these cases, it has been found that the addition of an alternative source of hydrogen atoms such as amines can restore the photosolubilising properties of the system. It has been found that there is an approximately 1:1 molar ratio relationship between onium salts and amines in such systems, as is shown in FIG. 1, in which "t" is the time in minutes to dissolve a film of novolac resin containing 15% iodonium salt in 6% aqueous sodium metasilicate pentahydrate and "ratio" is the tributylamine:diphenyliodonium hexafluorophosphate molar ratio. From the Figure it can be seen that the addition of amine to a novolac resin-onium salt system restores the photosolubility markedly up to an equimolar ratio with the onium salt, and any surplus amine has little effect on the degree of photosolubilisation. However, if the amine is soluble in developer, as in the Example shown, it can still affect the solublity of the film in non-irradiated areas. It is, therefore, beneficial not to have a large surplus of a soluble amine as it can reduce the differential in solubility between exposed and non-exposed regions and also can effect the shelf life of the system. A preferred range of the molar ratio is from 0.5:1 to 3:1, most preferably 1:1. The amine content generally comprises up to 25% by weight of the total weight of phenolic resin, onium salt and amine.

One of the requirements for a commercially viable printing plate is that it should exhibit a visible image at both post-exposure and post-development stages. In the systems which need a hydrogen atom source to render them more easily photosolubilising, it is possible to use compounds which are also the leuco forms of dyes. Upon exposure to light, such systems generate the oxidised form of the dye in exposed areas resulting in a highly coloured visible image. One such useful material is bis(4-dimethylaminophenyl)methane which is essentially colourless, but gives a dense blue image upon oxidation with an iodonium salt. The reaction which is believed to occur is as follows:

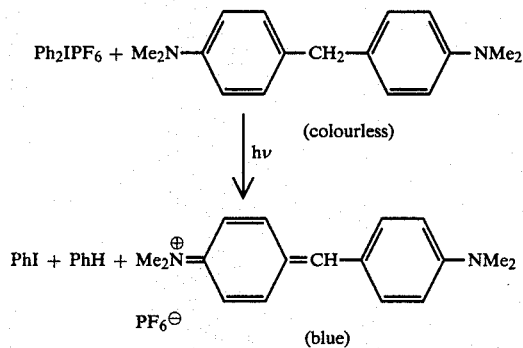

A further advantage of using compounds such as bis(4-dimethylaminophenyl)methane as additives to the described compositions is that they enhance the solubility differential between exposed and unexposed areas. This is due to the amine initially imparting hydrophobicity to the coating as it is not soluble in the aqueous developer. After exposure the amine is oxidised to an ionic dye which is soluble in developer. Thus, it is possible to prepare photosolubilising coatings which after exposure may quickly and completely dissolve in developer, e.g. 20 seconds, compared to the unexposed areas which only lose approximately 15% of the weight after 180 seconds.

Radiation-sensitive elements in accordance with the invention are prepared by coating a suitable substrate with a layer of a composition of the invention from a suitable solvent. Exemplary substrates include fibre base materials such as paper, polyethylene-coated paper, polypropylene-coated paper, parchment, cloth and the like; sheets and foils of such metals as aluminium, copper, magnesium and zinc; glass and glass coated with such metals as chromium, chromium alloys, steel, silver, gold and platinum; synthetic polymeric materials such as poly(alkyl methacrylates), e.g. poly(methyl methacrylate), polyesters, e.g. poly(ethylene terephthalate), poly(vinylacetals), polyamides, e.g. Nylon, cellulose esters, e.g. cellulose nitrate, cellulose acetate, cellulose acetate propionate, cellulose acetate butyrate; and the like.

Typical lithographic support materials wnich are useful in the invention include supports such as zinc, anodized aluminium, grained aluminium, copper and specially prepared metal and paper supports; superficially hydrolysed cellulose ester films; polymeric supports such as polyolefins, polyesters, polyamide and the like.

The supports can be sub-coated with known subbing materials such as copolymers and terpolymers of vinylidene chloride with acrylic monomers (such as acrylonitrile and methyl acrylate) and unsaturated dicarboxylic acids (such as itaconic acid or acrylic acid); carboxymethyl cellulose, polyacrylamide; and similar polymeric materials.

The support can also carry a filter or antihalation layer, such as one comprising a dyed polymer layer which absorbs the exposing radiation after it passes through the radiation-sensitive layer and eliminates unwanted reflection from thWne support. A yellow dye in a polymeric binder, such as one of the polymers referred to above as suitable sub-coatings, is an especially effective antihalation layer when ultraviolet radiation is employed as the exposing radiation.

The radiation-sensitive elements of the invention can be used to produce a positive lithographic image by image-wise exposing the element to actinic radiation and thereafter developing the element with a suitable developer so that the composition is removed in the irradiated areas thereby producing said image. Preferably, the developer is an aqueous alkali-based solution although other developers which preferentially dissolve the irradiated areas may be used.

The radiation-sensitive elements of the invention may also be utilised to produce a negative image in a similar manner to the technique disclosed in British Patent Application Publication No. 2 082 339A.

British Patent Application Publication No. 2 082 339A discloses a light-sensitive composition for coating lithographic plates to provide for positive/negative processing and comprises an orthoquinone diazide and at least one resole resin. In order to obtain a lithographic image from a positive original the lithographic plate is exposed to light through the positive original and thereafter developed with an alkali-based developer so that the coating is removed from the irradiated areas of the plate. A lithographic image from a negative original is obtained by exposing the plate to light through the negative original, heating the plate so as to convert the coating in the irradiated areas to a form insoluble in alkali, thereafter further exposing the plate overall to light so that the areas not previously irradiated are rendered alkali-soluble wnereas the areas previously irradiated remain insoluble in alkali and developing the plate with an alkali-based developer so as to remove the coating from those areas of the plate where it is rendered soluble by the further exposure.

The radiation-sensitive elements of the invention may be utilised to produce a negative image by image-wise exposing the element to actinic radiation, heating the element so as to convert the coating in the irradiated areas to a form insoluble to alkali, further exposing the element overall to actinic radiation so that areas not previously exposed are rendered alkali-soluble, and developing the element with a developer so that the coating is removed from those areas of the element rendered soluble by the further exposure thereby producing the image.

After development, the radiation-sensitive elements of the invention may be subjected to a further heat treatment, e.g. at 220° C. for about 10 minutes to improve the solvent resistance of the element.

Compositions of the invention may also be used as positive photoresists for the preparation of metal-clad printed circuit boards, e.g. copper sheet laminated to an epoxy resin board. In this instance, the copper would be coated with the photosensitive composition. After exposure the solubilised material would be removed leaving an integral mask. Unprotected areas of copper would then be removed by etching such as with aqueous ferric chloride solution.

The compositions of the invention may also be used to protect other materials such as amorphous $SiO_2$. Silica is often used in the fabrication of electronic devices and integrated circuitry and the contact patterns for these devices are often defined through photomasks.

The compositions of the invention may contain other ingredients such as stabilising additives, inert colourants, lithographic printing aids, e.g. tung oil, and additional non-reactive polymeric binders. Generally, the total amount of such ingredients does not amount to more than 70% based on the total weight of phenolic resin, onium salt and additional ingredients.

The invention will now be more particularly described with reference to the following Examples.

In the Examples the following commercially available products were used:

BKR 2620—a resole type resin commercially available from Bakelite Xylonite Ltd.
Arofene 24780—a phenolic resin commercially available from Ashland Chemicals Co.
CRJ 406—a phenolic resin commercially available from Schenectady Chemicals Inc.
Multilith—an offset press commercially available from A.M. Multigraphics Ltd.
Reichhold 29802—a novolac resin commercially available from Reichhold Chemicals Inc.
Ascor—an exposure unit commercially available from Berkey Technical
Waxoline Yellow TS—a solvent soluble quinoline dye
Waxoline Rubin—a solvent soluble anthraquinone dye
Victoria Blue—a water-soluble triarylmethane dye
Model 299SL—an overhead projector commercially available from Minnesota Mining and Manufacturing Company
PL 5000—an exposure unit commercially available from Parker Graphics Ltd.
No. 4 Wratten filter—commercially available from Kodak Limited
FOGRA PMS2—a plate control wedge commercially available from FOGRA Institute, Switzerland
UGRA/Gretag—a plate control wedge 1982 commercially available from UGRA, Switzerland
NuArc platemaker—commercially available from NuArc Company Incorporated, Chicago, U.S.A.

EXAMPLES 1 TO 4

Method

A coating solution was prepared by the following technique. 10 g of phenolic resin BKR 2620 was dissolved in 30 g of butan-2-one.

To 5 g aliquots of the resin solution were added, i.e. 1.25 g resin:

(1) 0.05 g of diphenyliodonium hexafluorophosphate ($Ph_2IPF_6$),
(2) 0.1 g $Ph_2IPF_6$,
(3) 0.2 g $Ph_2IPF_6$,
(4) 0.4 g $Ph_2IPF_6$, respectively. Using these solutions, coatings were made under subdued lighting conditions, using a No. 3 wire-wound coating bar manufactured by RK Print-Coat Instruments Ltd., and slurry-grained aluminium as the substrate. The coatings were then air dried overnight in the dark and then for 1 minute at 100° C. Samples measuring 15 cm×8 cm were then exposed by the following means. The samples were placed in vacuum contact with a photographic step wedge comprising 0.15 increments in optical density per step and a 60 lines per cm screen test target in which areas were covered with 3 to 97% dots, made by Colour Service Inc. The UV source was a 5 kW metal halide lamp fitted in a Parker Graphics Ltd. PL 5000 exposure unit. The samples were irradiated by 25 units (about 70 seconds) at a distance of 0.7 m. The exposed areas were slightly pink in colour and upon immersion in developer solution, which was 6% aqueous sodium metasilicate pentahydrate, preferentially dissolved leaving a high quality positive image of hydrophobic phenolic resin on a hydrophilic aluminium substrate. The results are given in Table 1.

TABLE 1

| Example No. | Weight % of iodonium based on resin | Time in developer to give 2 to 3 clear steps |
|---|---|---|
| 1 | 4 | 20 seconds |
| 2 | 8 | 80 seconds |
| 3 | 16 | 200 seconds |
| 4 | 32 | 500 seconds |

The above experiments show that coatings containing higher levels of iodonium salts are slower to solubilise than coatings containing lower levels of iodonium salts. This is as would be expected because the more of the insolubilising iodonium salt present in a coating, the more resistant to alkali the coating would be and more iodonium salt needs to be photolytically decomposed. Consequently, there is an optimum level for iodonium salt concentration in each resin to achieve the best balance between rate of photosolubilisation and the greatest differential between exposed and non-exposed areas with respect to alkali resistance.

EXAMPLES 5 TO 8

Method

A coating solution was prepared by the following technique. 10 g of a phenolic resin Arofene 24780 was dissolved in 30 g of butan-2-one. To 5 g aliquots of this solution was added:

(5) 0.05 g $Ph_2IPF_6$
(6) 0.1 g $Ph_2IPF_6$
(7) 0.2 g $Ph_2IPF_6$
(8) 0.4 g $Ph_2IPF_6$ respectively. Using these solutions, coatings were made on an aluminium substrate with a No. 3 wire-wound coating bar. These coatings were dried immediately at 85° C. for 2 minutes. Exposures were made using the same test targets and exposure source as described in Examples 1 to 4. The source was positioned 0.7 m from the test samples and they were irradiated for 25 units. The results are given in Table 2.

TABLE 2

| Example No. | % iodonium based on resin | No. of steps clear after 40 second development |
|---|---|---|
| 5 | 4 | * |
| 6 | 8 | 5 |
| 7 | 16 | 3 |
| 8 | 32 | 1 |

*After 20 seconds in 6% developer there was substantial coating weight loss in non-exposed areas.

A similar trend was observed in these Examples, which used Arofene 24780 as the resin, as was seen in Examples 1 to 4 which used BKR 2620 as the resin. If the percentage of iodonium ion in the resin falls too low, then the coating does not have sufficient resistance to alkali attack. If the iodonium level is too high, then the photosolubilisation process becomes too slow to have a practical use.

EXAMPLES 9 TO 17

The following series of Examples demonstrate the range of iodonium salts which have been found to be useful in the present invention.

The experimental method consisted of taking 5 g of 25% w/w Arofene 24780 in butan-2-one and adding to it the quantities of the iodonium salts shown in the following Table 3.

All samples were exposed and developed as previously described. All compounds in Examples 9 to 17 insolubilised the resin to some degree. With the exception of Examples 17 and 12, which were only slightly solubilised, all the Examples gave a reasonable differential between exposed and non-exposed areas with respect to the rate of dissolution of the coating in dilute sodium metasilicate pentahydrate. Compound Nos. 9, 11, 15 and 16 were found to be somewhat better than those of Examples 10 and 13. It was also observed that the addition of diphenyliodonium-2-carboxylate gave only a very poorly, if at all insolubilised phenolic resin. This is probably because the betaine structure having intramolecular charge compensation inhibits intermolecular association with the resin.

TABLE 3

| Example | Iodonium cation | Anion | Quantity |
|---|---|---|---|
| 9 | 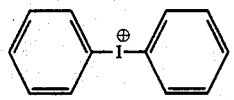 | $PF_6$ | 0.21 g |
| 10 | 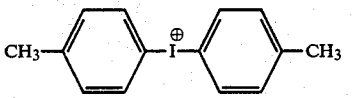 | $PF_6$ | 0.23 g |
| 11 | 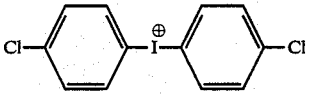 | $PF_6$ | 0.25 g |
| 12 | 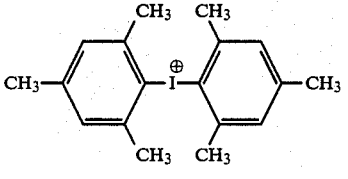 | $PF_6$ | 0.23 g |
| 13 | 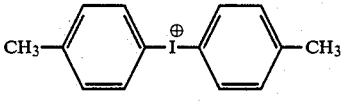 | Cl | 0.2 g |
| 14 | 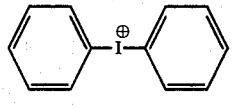 | Br* | 0.2 g |
| 15 | 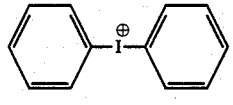 | $SbF_6$ | 0.2 g |
| 16 | 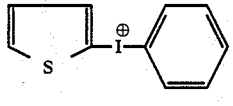 | $CF_3CO_2$ | 0.2 g |
| 17 | 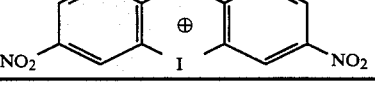 | $PF_6$ | 0.13 g |

*Insufficiently soluble to evaluate

EXAMPLES 18 TO 22

The following Examples demonstrate the behaviour of a novolac type resin with the addition of an iodonium salt and various levels of amine.

5 g of CRJ 406 phenolic resin was dissolved in 15 g methanol. To this was added 0.8 g of diphenyliodonium hexafluorophosphate (~16% by weight of resin). The amounts of tri-n-butylamine then added to 2.5 g aliquots of the resin/iodonium solution are given in Table 4.

TABLE 4

| Example No. | Amount of Bu$_3$N (g) | Molar ratio of iodonium:amine |
|---|---|---|
| 18 | 0 | — |
| 19 | 0.025 | 1:0.58 |
| 20 | 0.050 | 1:1.16 |
| 21 | 0.075 | 1:1.74 |
| 22 | 0.1 | 1:2.3 |

Coatings were made using these solutions by the procedures described earlier and the samples were then exposed, and subsequently developed, in dilute sodium metasilicate pentahydrate solution. It had been observed on previous occasions, and again in this series of experiments, that the addition of base to the iodonium/resin system increases or at least accelerates the interaction between the two compounds. This is not unexpected as the phenolic resin, which is the electron donor, is converted to the anionic form, which will associate more readily with the iodonium salt, i.e. the electron acceptor.

The physical effect of this is seen by the increase in alkali resistance exhibited by coatings to which a small amount of base has been added. For example, in Example 18 no amine was added and the alkali resistance of the coating was about 75 seconds. In Example 19, which had a small amount of amine added, the alkali resistance dramatically rose to in excess of 10 minutes. It is desirable to have a coating as resistant to alkali as possible to begin with so there is the scope to obtain a large differential in solubility after exposure. The result of the exposures and development of Examples 18 to 22 are shown in Table 5.

TABLE 5

| Example No. | Colour in irradiated areas | Development time to clear background |
|---|---|---|
| 18 | red | —* |
| 19 | pink | 15 mins |
| 20 | slightly yellow | 1 min |
| 21 | slightly mauve | 30 secs |
| 22 | mauve | 15 secs |

*Only a poor differential.

There are a number of trends which can be seen from Tables 4 and 5. Example 18 shows that although quite an intense red image forms in irradiated areas, the coating did not markedly photosolubilise in comparison to the other Examples. The mechanisms which occur are not fully understood but it is very likely that, as iodonium salts are oxidising agents and phenols can be oxidised to red products, the red image is caused by an oxidation product of the phenolic resin. As tne phenolic resin relies on tne —OH groups for its alkali solubility, then oxidation of these to keto groups will reduce or prevent dissolution in base.

The addition of amine appeared to prevent this reaction occurring and it can be seen that, quite dramatically as increasing amounts of amine are added, the red colour in exposed areas becomes fainter, eventually disappearing altogether to leave a yellowish image. Upon further addition of amine, a mauve colouration appears. At the same time, the system becomes more and more photosolubilising with the major difference being seen between Examples 19 and 20. These two Examples correspond to amine:iodonium ratios of 0.58:1 to 1.16:1. As discussed earlier, there is a 1:1 reaction ratio between amine and iodonium in this system and if a large excess of amine is added it can be deleterious to the storage properties of the system, due to "dark" reactions between iodonium salts and amines.

EXAMPLES 23 TO 26

The following four Examples demonstrate systems incorporating a source of hydrogen ions which give very good visible images in exposed areas due to dye formation.

2.5 g of CRJ 406 resin was dissolved in 11.5 g of butan-2-one and to this was added 0.7 g of diphenyliodonium hexafluorophosphate. Various amounts of bis(4-dimethylaminophenyl)methane (BDAPM) were then added to 3.675 g aliquots as shown in Table 6.

TABLE 6

| Example No. | Amount of Amine (g) | Molar ratio of iodonium:amine |
|---|---|---|
| 23 | 0 | — |
| 24 | 0.14 | 1:1.34 |
| 25 | 0.175 | 1:1.68 |
| 26 | 0.2 | 1:1.92 |

Coatings were made using these solutions and a K-2 wire-wound coating bar onto an aluminium substrate. The coatings were dried at 85° C. for 90 seconds before evaluation.

Exposures were made using the PL 5000 exposing frame at a distance of 0.7 m for 16 units, with subsequent development in 6% aqueous sodium metasilicate pentahydrate. The results of this series of experiments show that Example 23 had not photosolubilised very efficiently and also did not have a blue image in exposed areas, whereas Examples 24 to 26 all had very deep blue images which dissolved easily in the developer. There was no significant difference between them. The unexposed regions of all samples withstood longer than 10 minutes immersion in developer without significantly dissolving, thus giving a high contrast in solubility between exposed a non-exposed areas,. The BDAPM contributes to this solubility differential as described earlier.

The following Examples 27 to 29 demonstrate the ability of the phenolic resin/iodonium system to be sensitised to visible light.

EXAMPLES 27 AND 28

A stock solution containing 25% w/w Arofene 2478 in butan-2-one was prepared. To a 5 g aliquot of this solution were added 0.2 g of diphenyliodonium hexafluorophosphate and 0.02 g of a cyanine dye shown in Table 7.

TABLE 7

| Example No. | Dye | $\lambda_{max}$ |
|---|---|---|
| 27 | (structure with two N-Me indoline groups linked by pentadienyl chain, PECHS⁻ counterion) | 555 nm |
| 28 | (structure with two N-Me indoline groups linked by chain, PECHS⁻ counterion) | 645 nm |

PECHS = perfluoro(4-ethylcyclohexyl)sulphonate

Coatings were prepared using a K-3 wire-wound coating bar onto an aluminium substrate. Samples were air dried for three days before use. Exposures of these two coatings were carried out in two different ways.

In one instance a 150 Watt xenon lamp was used as the source. This was positioned 7.6 cm (3") away from the sample, over which was placed a No. 4 Kodak Wratten filter. This only permits light of wavelengths ~460 nm to be transmitted, so that only light corresponding to the absorption of the cyanine dyes is absorbed. The samples were exposed for 10 minutes, after which they were immersed in an aqueous sodium metasilicate pentahydrate solution. Both samples preferentially dissolved in the exposed regions, demonstrating that photosolubilisation had occurred.

EXAMPLE 29

To 5 g of a 25% w/w BKR 2620 resin in butan-2-one were added 0.2 g of diphenyliodonium hexafluorophosphate and 0.04 g of the oxonol dye shown below:

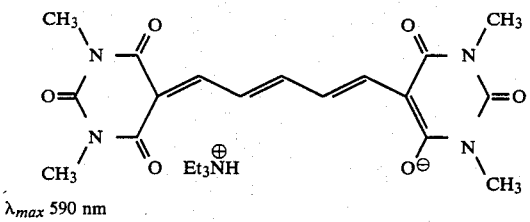

$\lambda_{max}$ 590 nm

A coating on aluminium was prepared as in the previous two Examples. In this case the coating was dried at 50° C. for 30 minutes before use.

The exposure source in this case was a 1 mW He-Ne laser which emits at 630 nm. The spot size was 1.3 mm diameter and exposure time was 10 seconds; this corresponds to ~$10^6$ mJ/m².

Subsequent development in a 3% aqueous sodium metasilicate pentahydrate solution preferentially dissolved the irradiated areas. This experiment shows that although the $\lambda_{max}$ of the dye was ~40 nm from the emission of the laser, sufficient energy was absorbed to achieve photosolubilisation.

The following Examples 30 to 34 show how the phenolic resin/iodonium system can be sensitised to the output of an Argon Ion laser emitting at 488 nm.

EXAMPLES 30 TO 32

1.25 g of a 25% Arofene 24780 resin solution in butan-2-one was mixed with 0.1 g diphenyliodonium hexafluorophosphate and 0.02 g of the oxonol type dyes shown in Table 8.

The coatings were made with a K-2 wire-wound bar onto an aluminium substrate and were dried for two minutes at 85° C.

The samples were exposed to the output of a nominally 10 mW Argon Ion laser, through a 1.91 neutral density filter. Dwell times were varied for 5 ms, 1.8 ms, 0.5 ms, 180 μs, 50 μs, to 18 μs. The samples were then developed in 6% aqueous sodium metasilicate pentahydrate for 1 to 1.5 minutes. Microscopic study of the resultant samples indicate that the 18 μs dwell time was sufficient exposure for solubilisation to occur. Calibration of the laser energy at the sample surface for an 18 μs dwell time suggests a sensitivity of $1.025 \times 10^5$ mJ/m².

TABLE 8

| Example | Dye | $\lambda_{max}$ |
|---|---|---|
| 30 | (structure with CO₂Et, CN groups, O⁻ NHEt₃⁺ counterion, N-Me) | 460 nm E = $6.5 \times 10^4$ |
| 31 | (structure with CO₂Et, CN, OEt groups, K⁺ counterion) | 450 nm E = $1.0 \times 10^5$ |
| 32 | (structure with two dimedone-like rings linked by trimethine chain, O⁻ NHEt₃⁺ counterion) | 502 nm E = $1.2 \times 10^5$ |

EXAMPLE 33

A similar experiment was run using CRJ 406 resin; a coating was made from a solution of 1.25 g of a 25% CRJ 406 resin in butan-2-one with 0.05 g of diphenyliodonium hexafluorophosphate and 0.02 g of oxonol dye shown in Example 31 in Table 8.

Exposures were made as previously described. After development in 6% aqueous sodium metasilicate pentahydrate, examination under an optical microscope revealed that the 50 μs dwell time was sufficient exposure to solubilise the coating.

EXAMPLE 34

A coating was prepared from a solution containing 1.25 g of 25% CRJ 406 resin in butan-2-one with 0.05 g of diphenyliodonium hexafluorophosphate, 0.05 g of bis(p-dimethylaminophenyl)methane, and 0.02 g of the oxonol dye shown in Example 30 (Table 8).

Exposures were made as previously described and after development in 6% sodium metasilicate pentahydrate, examination under an optical microscope revealed that a 50 μs exposure was sufficient to cause solubilisation of the coating.

The following Examples 35 to 38 show how the phenolic resin/iodonium system can be sensitised to infrared irradiation by the use of cyanine dyes.

EXAMPLE 35 1.25 g of a 25% Arofene 24780 resin solution in butan-2-one was mixed with 0.06 g of diphenyliodonium hexafluorophosphate and 0.005 g of the heptamethinecyanine dye shown below:

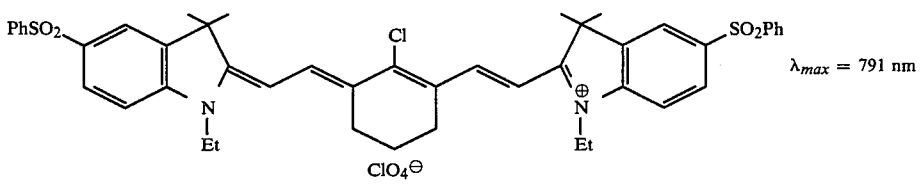

A coating on aluminium was prepared using a No. 3 wire-wound bar in the normal way; the sample was air dried before evaluation. The exposure source was a laser diode emitting at 812 nm, with a power output of $\sim 10^6$ mJ/m$^2$. The laser was fitted with scanning capabilities, thus enabling the exposure to be varied by varying the dwell times of the laser spot on the sample. Exposures was made where dwell times were used of 5 ms, 500 μs, 50 μs and 5 μs. Subsequent development of the sample using 6% sodium metasilicate pentahydrate cleared the 50 μs spots and the 5 us spots could be seen. The former value corresponds to a sensitivity of approximate $10^6$ mJ/m$^2$.

EXAMPLES 36 TO 38

These Examples are as in Example 35 but using a somewhat higher level of dye and extending the range of the dyes by varying the N-alkyl group. The coatings were made from the following formulation: 1.25 g of a 25% w/w Arofene 24780 resin solution in butan-2-one with 0.06 g of diphenyliodonium hexafluorophosphate and 0.02 g of a cyanine dye shown in Table 9.

Samples of each of these coatings were exposed using the laser diode as described in Example 35.

Subsequent development in 6% sodium metasilicate pentahydrate preferentially dissolved the 50 μs spots.

This corresponds to a sensitivity of approximately $5 \times 10^6$ mJ/m$^2$.

EXAMPLE 39

0.1 g of diphenyliodonium hexafluorophosphate was dissolved in 5 g of a 25% w/w solution of BKR 2620 in butan-2-one. Coatings were made with this solution as previously described and, after air drying, they were further dried at 100° C. for a few minutes. Images were made using standard Fogra PMS2 and Ugra/Gretag targets in a Parker Graphics PL 5000 flip-top exposing frame equipped with a 5 kW metal halide source. Exposure time was 40 seconds which corresponds to the exposure needed for positive-acting printing plates which are currently on the market. After exposure, development was achieved by immersion in 6% aqueous sodium metasilicate pentahydrate for 80 seconds with gentle agitation.

The resultant plate was run on a Multilith offset press for a short number of prints (ca. 100). The plate inked rapidly upon roll-up and no problems were noticed during the test run. The sample held 2 to 99% dots on a 60 lines per cm screened target, 8 to 96% dots on a 120 lines per cm screened target and resolved a 6 μm line.

EXAMPLE 40

This Example demonstrates that printing plates prepared from an iodonium/phenolic resin system can run for many thousands of copies without breakdown on press.

A solution was prepared containing 8.0 g of 25% w/w of Reichhold 29802 resin in butan-2-one; 0.1 g of diphenyliodonium hexafluorophosphate and 0.1 g of the yellow oxonol dye shown in Example 31. To 2.5 g of this solution 0.02 g of cellulose acetate butyrate was added and a coating was prepared on a grained aluminium substrate using a No. 6 Meyer, wire-wound coating bar. The coating was dried for 2 minutes at 85° C. The printing plate was then exposed on an Ascor exposure unit for about 15 seconds using standard test targets and grey scales. Subsequent development using 5.6% sodium metasilicate pentahydrate developer removed the irradiated areas giving a high quality image of hydrophobic resin on an aluminium substrate. This plate was then run on press which was set up in an accelerated wearing mode. By comparing the run length of the

TABLE 9

| Example No. | Dye | R | λ$_{max}$ |
|---|---|---|---|
| 36 | | ethyl | 791 nm |
| 37 | (structure shown) | n-butyl | 794 nm |
| 38 | | n-hexyl | 792 nm | experimental plate to commercial plates of known run length it was shown that the experimental plate ran for at least as long as the standard plates. This corresponds to approximately 200,000 copies on a normally prepared press.

EXAMPLE 41

This Example demonstrates the use of sulphonium salts in the present invention.

To 5 g of a 25% w/w solution BKR 2620 resin in butan-2-one was added 0.2 g of triphenylsulphonium hexafluorophosphate. This solution was used to prepare a coating on a slurry-grained aluminium substrate using a K-3 wire-wound coating bar. Before evaluation the coating was dried at 100° C. for one minute. Exposures of the sample was carried out using a 5 kW metal halide lamp at a distance of 0.7 m for about 30 seconds.

Development of the sample was achieved by immersion in a 6% aqueous sodium metasilicate pentahydrate for 100 seconds with slight agitation thus removing the exposed areas. Using this procedure samples can be produced with 3 to 97% dot retention on a 60 lines per cm screen target.

EXAMPLE 42

This Example demonstrates the feasibility of the resin-iodonium system to be useful as a colour proofing "tripack". The addition of an inert colourant is required to give the resultant image.

Three solutions were prepared containing 5 g of 25% w/w solution BKR 2620 resin in butan-2-one and 0.2 g diphenyliodonium hexafluorophosphate. To separate solutions were added 0.35 g of Waxoline Yellow TS, 0.025 g Victoria Blue and 0.1 g Waxoline Rubin. Coatings were prepared from these solutions using a No. 3 K-bar and 0.1 mm (0.004 in) clear polyester film as the substrate. After drying, the coatings were imaged in a vacuum frame using the appropriate colour separation target.

Exposure time was one minute and subsequent development was achieved by immersion in 3% w/w sodium metasilicate pentahydrate solution. The full colour original could be reconstructed by aligning the three sheets one upon each other to give a "tripack".

EXAMPLE 43

This Example demonstrates how an overhead projector can be used as a light source to produce enlarged copies from an original. These may have use as temporary signs, etc.

A coating solution was prepared containing 2.5 g of 25% w/w solution CRJ 406 resin, 0.1 g diphenyliodonium hexafluorophosphate and 0.084 g of the yellow dye of Example 31.

A coating was prepared from this solution using a K-3 wire-wound bar and an aluminium substrate. After drying for 2 minutes at 85° C. exposures was made by fastening a 15×15 cm sample onto a vertical surface and then projecting an image into this using a Model 229SL overhead projector positioned so as to give a tenfold enlargement in area. The exposure took 300 seconds and was carried out in a darkened room. Subsequent development in 3% sodium metasilicate pentahydrate solution preferentially dissolved the irradiated areas, leaving an enlarged copy of the original.

EXAMPLE 44

0.175 g of diphenyliodonium hexafluorophosphate and 0.14 g of bis-p-dimethylaminophenylmethane was added to 2.5 g of a 25% w/w solution of CRJ 406 resin in butan-2-one. Coatings were then prepared using a K-2 wire-wound coating bar onto an aluminium substrate. The coated substrate was then dried at 85° C. for 3 minutes in the dark.

To demonstrate the normal photosolubilising behaviour of this formulation an imaging exposure was made using a Parker Graphic PL 5000 exposure source for 25 units at a distance of 0.7 m. Subsequent development in 5.6% w/w aqueous sodium metasilicate pentahydrate preferentially dissolved the exposed areas giving a good quality, positive-acting printing plates.

Two samples of this coating were exposed through standard test targets for 25 units at 0.7 m. These samples were then heated for 30 seconds and 60 seconds at 120° C. respectively. Each coating was then given a second overall exposure to ultraviolet radiation (25 units at 0.7 m) followed by development in 5.6% w/w aqueous sodium metasilicate pentahydrate. The results showed that the samples which had been subjected to 120° C. for 30 seconds and 60 seconds both gave overall negative-acting coatings.

EXAMPLE 45

The formulation used was identical to that used in Example 44 except that the CRJ 406 resin was replaced with BKR 2620 resin. The results were also identical in that sample heated to 120° C. for 30 seconds and 60 seconds gave overall negative-acting plates.

EXAMPLE 46

0.09 g of diphenyliodonium hexafluorophosphate, 0.02 g of the yellow oxonol dye used in Example 43 and 0.002 g of a blue oxonol dye of the formula:

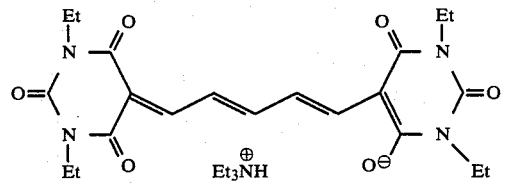

were added to 1.25 g of a 25% w/w CRJ 406 resin solution in butan-2-one. The solution was coated onto aluminium substrate using a K-2 wire-wound bar and dried at 85° C. for 3 minutes.

The coated plate exhibited the normal photosolubilising mode on exposure to test targets for 13 units at 0.7 m, followed by development in aqueous sodium metasilicate pentahydrate, whereupon the exposed portions preferentially dissolved leaving a high quality, positive-acting printing plate.

Three samples from the same coatings were also imaged for 13 units followed by heating at 120° C. for 30, 60 and 90 seconds, respectively, followed by an overall ultraviolet exposure for 13 units, then development in 5.6% w/w aqueous sodium metasilicate pentahydrate. The results were that overall negative-acting systems were obtained.

EXAMPLE 47

0.02 g of the yellow oxonol dye used in Example 43, 0.002 g of the blue oxonol dye used in Example 46 and 0.02 g of diphenyliodonium hexafluorophosphate were added to 2.5 g of a 25% w/w BKR 2620 resin solution in butan-2-one. Coatings were made using a K-2 wire-wound bar onto an aluminium substrate and dried at 85° C. for 3 minutes.

To demonstrate the normal positive action of the coated plate, a sample was exposed for 15 units at 0.7 m followed by development in dilute aqueous sodium metasilicate pentahydrate to give a positive image. If the sample was given an additional drying time for 30 seconds to 4 minutes at 120° C. before normal drying exposure, a positive system was still obtained although the rate of photosolubilisation was much slower. This is thought to be because the additional heating at 120° C. markedly increases the alkali resistance of the coating.

A second series of samples were also subjected to an additional drying time for 30 seconds to 4 minutes at 120° C. before being imaged through standard test targets for 15 units. After imaging they were heated at 120° C. for 60 seconds and then subjected to an overall ultraviolet exposure (15 units at 0.7 m). Subsequent development in aqueous sodium metasilicate pentahydrate preferentially dissolved away the non-imaged areas leaving an overall negative sample. The quality of these samples varied depending on the additional drying time, with the optimum being in the region of an additional 60 seconds at 120° C..

EXAMPLE 48

0.175 g of diphenyliodonium hexafluorophosphate was added to 2.5 g of a 25% w/w CJR 406 resin solution in butan-2-one. Coatings were prepared from this solution by using a K-2 wire-wound coating bar onto an aluminium substrate. The coating was dried for 3 minutes at 85° C. A sample was exposed for 25 units at 0.7 m followed by an overall heating at 120° C. for 60 seconds, then an overall ultraviolet exposure for 25 units at 0.7 m. Development in aqueous sodium metasilicate pentahydrate preferentially washed out the non-imaged areas giving an overall negative-acting system, although the differential in solubility between imaged and non-imaged areas was not large.

EXAMPLES 49 AND 50

Compositions containing phosphonium salts 10 g of BKR 2620 resin was dissolved in 30 g of butan-2-one.

To 2.5 g aliquots of the resin solution was added:
Example 49: 0.1 g of benzyltriphenylphosphonium hexafluorophosphate.
Example 50: 0.1 g of benzyltriphenylphosphonium hexafluorophosphate and 0.1 g of bis(4-dimethylaminophenyl)methane.

Using these solutions, coatings were made on an aluminium substrate using a No. 2 wire-wound coating bar. The coatings were then dried at 85° C. for 6 minutes. Exposures were made using a NuArc flip-top platemaker for 500 units.

Subsequent development in 6% aqueous sodium metasilicate pentahydrate preferentially dissolved the exposed areas of the coatings.

EXAMPLE 51

Example 49 was repeated using 2.5 g of a 25% CRJ 406 resin in place of the BKR 2620 resin. After 500 units of exposure, the irradiated areas were preferentially dissolved in 6% aqueous sodium metasilicate pentahydrate developer.

EXAMPLES 52 AND 53

Compositions containing sulphoxonium salts

A 25% w/w solution of BKR 2620 resin in butan-2-one was prepared.

To 2.5 g aliquots of the resin solution was added:
Example 52: 0.1 g of triphenylsulphoxonium hexafluorophosphate.
Example 53: 0.1 g of triphenylsulphoxonium hexafluorophosphate and 0.1 g of bis(4-dimethylaminophenyl)methane.

Using these solutions, coatings were prepared using a No. 2 wire-wound coating bar on an aluminium substrate. The coatings were dried for 6 minutes at 85° C.. Exposures were then made using the NuArc flip-top platemaker for 100 units. Subsequent development in 3% aqueous sodium metasilicate pentahydrate preferentially dissolved the exposed areas.

EXAMPLE 54

Compositions containing aryloxysulphonium salts

To 3.0 g of a 25% w/w solution of BKR 2620 resin in butan-2-one was added 0.25 g of diphenyl methoxysulphonium tetrafluoroborate. Using this solution a coating was made onto an aluminium substrate using a No. 3 wire-wound coating bar. The coating was then dried for 6 minutes at 85° C. The sample was exposed for 100 units on a NuArc flip-top platemaker and then developed in 6% aqueous sodium metasilicate pentahydrate solution. The exposed areas preferentially dissolved showing that photosolubilisation had occurred.

EXAMPLE 55

To 2.5 g of 25% w/w solution of CRJ 406 resin in butan-2-one, 0.1 g of diphenylmethoxysulphonium hexafluorophosphate was added. Using this solution a coating was made onto an aluminium substrate using a No. 3 wire-wound coating bar. The coating was dried for 6 minutes at 85° C. The sample was then exposed for 100 units using a NuArc flip-top platemaker. After exposure the sample was developed in 3% aqueous sodium metasilicate pentahydrate solution whereupon the exposed areas preferentially dissolved.

EXAMPLE 56

To 5.0 g of a 25% w/w solution of CRJ 406 resin in butan-2-one was added 0.1 g of diphenyliodonium hexafluorophosphate, 0.04 g of the oxonol dye used in Example 31 and 0.18 g of bis(4-dimethylaminophenyl)methane. This solution was then coated onto an aluminium substrate using a No. 2 wire-wound coating bar and dried for 3 minutes at 85° C.. Exposures were then made using a NuArc flip-top platemaker and the samples were subsequently developed in a 3% aqueous solution of sodium metasilicate pentahydrate. This coating, which had a visible image after exposure, required only 10 units (approximately 8 seconds) exposure to achieve complete solubilisation within 20 seconds in the developer. The unexposed areas were highly resistant to developer: only approximately 10% of the coating weight was lost after immersion for 180 seconds in an aqueous solution of 3% sodium metasilicate pentahydrate.

I claim:

1. A radiation-sensitive composition comprising an alkali-soluble novolac phenolic resin and a radiation-sensitive onium salt, characterised in that the composition is photosolubilisable and that the onium salt is selected from the class consisting of iodonium, sulphonium, phosphonium, bromonium, chloronium, oxysulphoxonium, oxysulphonium, sulphoxonium, selenonium, telluronium and arsonium salts and the onium salt is present in an amount from 1 to 40% by weight of the total weight of phenolic resin and onium salt, the interaction of the phenolic resin and onium salt producing an aqueous solvent resistant composition to which is restored the alkali-solubility of the phenolic resin upon the photolytic decomposition of the onium salt, all the resin within said composition being without acetal or ketal groups necessary to photosolubilise the composition.

2. A composition as claimed in claim 1, characterised in that the resin is a resole resin and the onium salt is present in an amount from 5 to 40% by weight of the total weight of phenolic resin and onium salt.

3. A composition as claimed in claim 1 characterised in that the onium salt has one of the following formulae:

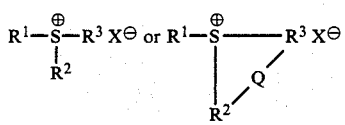

in which:
at least one of $R^1$, $R^2$ and $R^3$ is an optionally substituted aromatic group,
Q is a carbon-to-carbon bond or a linking group selected from

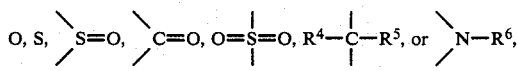

in which $R^4$ and $R^5$ are independently selected from H, an alkyl group having from 1 to 4 carbon atoms, and an alkenyl group having from 2 to 4 carbon atoms, and $R^6$ is an aryl group having from 6 to 20 carbon atoms or an acyl group having from 2 to 20 carbon atoms; and
$X^\ominus$ is an anion,

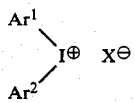

in which:
$Ar^1$ and $Ar^2$ independently represent aromatic groups which are optionally substituted and optionally linked together to include the iodine atom within a ring structure; and
$X^\ominus$ represents an anion,

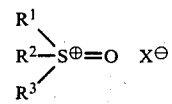

in which $R^1$ to $R^3$ are as defined above, with the exception that each of $R^1$ to $R^3$ may represent optionally substituted aliphatic groups,

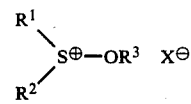

in which $R^1$ to $R^3$ are as defined above, with the exception that each of $R^1$ to $R^3$ may represent optionally substituted aliphatic groups,

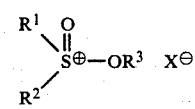

in which $R^1$ to $R^3$ are as defined above, with the exception that each of $R^1$ to $R^3$ may represent optionally substituted aliphatic groups, and
a polymer including the monomeric units of the formula:

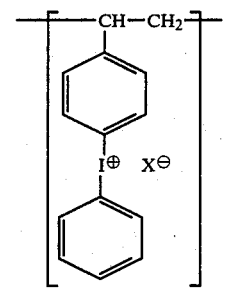

in which $X^\ominus$ is an anion.

4. A composition as claimed in claim 3, characterised in that the anion is selected from halide, $H_2SO_4^\ominus$, $R^8CO_2^\ominus$, in which $R^8$ represents an alkyl which may be substituted or not or phenyl group which may be substituted or not, and a halogen-containing complex ion.

5. A composition as claimed in claim 1 additionally comprising a spectral sensitiser in an amount up to 10% by weight of the total weight of phenolic resin, onium salt and spectral sensitiser.

6. A composition as claimed in claim 5, characterised in that the spectral sensitiser is selected from one of the following classes diphenylmethane, xanthene, acridine, methine and polymethine (including oxonol, cyanine and merocyanine) dye, thiazole, thiazine, azine, aminoketone, porphyrin, coloured aromatic polycyclic hydrocarbon, p-substituted aminostyryl compound, aminotriazyl methane, polyarylene, polyarylpolyene, 2,5-diphenylisobenzofuran, 2,5-diarylcyclopentadiene, diarylfuran, diarylthiofuran, diarylpyrrole, polyarylphenylene, coumarin and polyaryl-2-pyrazoline.

7. A composition as claimed in claim 5 characterised in that the spectral sensitiser has the formula:

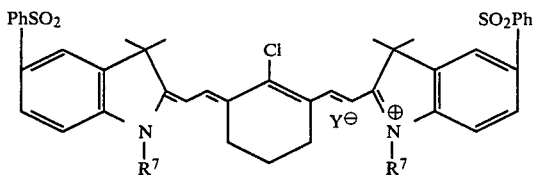

or

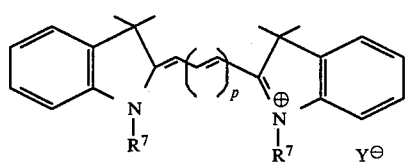

in which:

R[7] represents an alkyl group of 1 to 6 carbon atoms,

Y⊖ represents 4-perfluoroethylcyclohexylsulphonate or ClO₄⊖, and p is 1 or 2.

8. A composition as claimed in claim 1 additionally comprising an amine in an amount up to 25% by weight of the total weight of phenolic resin, onium salt and amine.

9. A composition as claimed in claim 8, characterised in that the molar ratio of amine to onium salt is approximately 1:1.

10. A composition as claimed in claim 8 characterised in that the amine is tri-n-butylamine or bis(4-dimethylaminophenyl)methane.

11. A radiation-sensitive element comprising a layer of the composition of claim 1 coated on a substrate.

12. An element as claimed in claim 11, characterised in that the substrate is paper, aluminium, copper, copper-epoxy laminated board, polyester film or silica.

13. A radiation-sensitive composition comprising an alkali-soluble novolac phenolic resin and a radiation-sensitive onium salt, characterised in that the composition is photosolubilisable and in that the onium salt is selected from iodonium, sulphonium, phosphonium, bromonium, chloronium, oxysulphoxonium, oxysulphonium, sulphoxonium, selenonium, tellurium and arsonium salts, and in that the onium salt is present in an amount from 1 to 40% by weight of the total weight of phenolic resin and onium salt, all the resin within said composition being without actal or ketal groups necessary to photosolubilise the composition.

14. A radiation-sensitive composition comprising an alkali-soluble novolac phenolic resin and a radiation-sensitive onium salt, characterised in that the composition is photosolubilisable and that the onium salt is diphenyliodonium hexafluorophosphate and the onium salt is present in an amount from 1 to 40% by weight of the total weight of phenolic resin and onium salt, the interaction of the phenolic resin and onium salt producing an aqueous solvent resistant composition to which is restored the alkalisolubility of the phenolic resin upon the photolytic decomposition of the onium salt, all of the resins within said composition being without acetal or ketal groups necessary to photosolubilize the composition.

\* \* \* \* \*

UNITED STATES PATENT AND TRADEMARK OFFICE
CERTIFICATE OF CORRECTION

PATENT NO. : 4,708,925

DATED : November 24, 1987

INVENTOR(S) : Newman

It is certified that error appears in the above-identified patent and that said Letters Patent is hereby corrected as shown below:

Column 6, line 44 "sulPhonium" should be --sulphonium--.

Column 7, line 25 "achieveo" should be --achieved--.

Column 9, line 57 "wnich" should be --which--.

Column 10, line 7 "thWne" should be --the--.

Column 10, line 40 "wnereas" should be --whereas--.

Column 11, line 1 "Ihe" should be --The--.

Column 15, line 62 "tne phenolic" should be --the phenolic--.

Column 15, line 63 "tne -OH" should be --the -OH--.

Column 16, line 55 "a" should be --and--.

Column 16, line 55 "areas,." should be --areas.--.

Column 16, line 64 "2478" should be --24780--.

Column 23, line 61 "solutiohs" should be --solutions--.

UNITED STATES PATENT AND TRADEMARK OFFICE
CERTIFICATE OF CORRECTION

PATENT NO. : 4,708,925

DATED : November 24, 1987

INVENTOR(S) : Stephen Newman

It is certified that error appears in the above-identified patent and that said Letters Patent is hereby corrected as shown below:

Column 28, line 19 "actal" should be --acetal--.

Signed and Sealed this

Seventh Day of November, 1989

Attest:

JEFFREY M. SAMUELS

Attesting Officer     Acting Commissioner of Patents and Trademarks